(12) United States Patent
Kondo (10) Patent No.: US 6,650,164 B2
(45) Date of Patent: Nov. 18, 2003

(54) OFF-LEAK CURRENT CANCEL CIRCUIT

(75) Inventor: Mamoru Kondo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/151,157

(22) Filed: May 21, 2002

(65) Prior Publication Data

US 2002/0175733 A1 Nov. 28, 2002

(30) Foreign Application Priority Data

May 22, 2001 (JP) ........................................ 2001/151999

(51) Int. Cl.[7] ................................................. H03K 5/08
(52) U.S. Cl. ...................... 327/309; 361/91.5; 361/91.1; 327/310
(58) Field of Search ................................. 327/308, 313, 327/309, 314, 318, 319, 320, 321, 322, 327, 328, 310; 361/91.1, 91.5

(56) References Cited

U.S. PATENT DOCUMENTS 5,079,516 A * 1/1992 Russell et al. ............... 330/261
5,563,587 A * 10/1996 Harjani ...................... 340/870.3
6,222,780 B1 * 4/2001 Takahashi ................... 365/189.09

* cited by examiner

*Primary Examiner*—Tuan T. Lam
*Assistant Examiner*—Hiep Nguyen
(74) *Attorney, Agent, or Firm*—Volentine Francos, PLLC (57) ABSTRACT

An off-leak current cancel circuit includes an input protection circuit having a first protection transistor connected between a terminal and a high power potential, and a second protection transistor connected between the terminal and a low power potential. The first and second protection transistors flow first and second off-leak currents. A current cancel circuit has a first monitor transistor for flowing a third off-leak current that is smaller than the first off-leak current, and a cancellation circuit for flowing the first off-leak current to the low power potential responsive to the third off-leak current. A current providing circuit has a second monitor transistor for flowing a fourth off-leak current that is smaller than the second off-leak current, and a providing circuit for providing the second off-leak current from the high power potential responsive to the fourth off-leak current.

17 Claims, 6 Drawing Sheets

OFF-LEAK CURRENT CANCEL CIRCUIT

BACKGROUND OF THE INVENTION

The present invention relates to an off-leak current cancel circuit for canceling off-leak current of a MOS transistor in a CMOS semiconductor integrated circuit.

Figure 2:
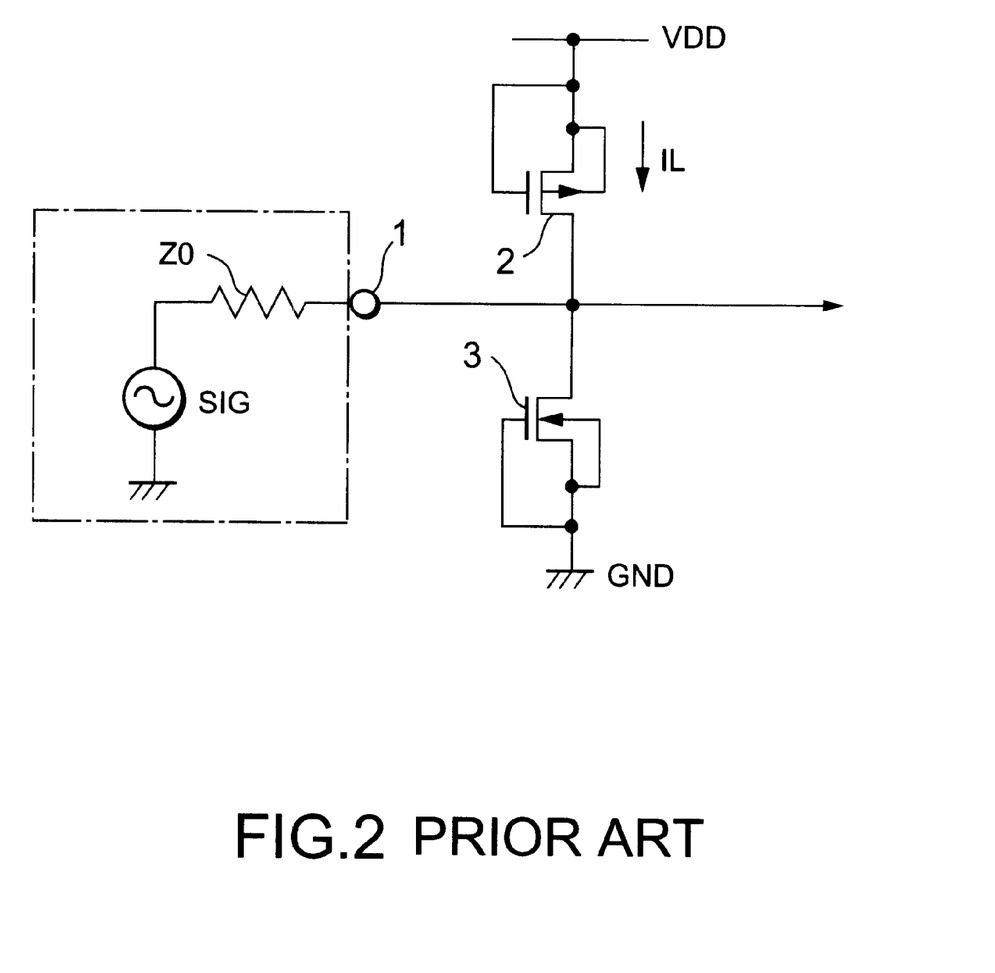
FIG. 2 shows an example of an input portion in a conventional CMOS semiconductor integrated circuit.

FIG. 2 shows a configuration example of an input portion of a conventional CMOS semiconductor integrated circuit.

In this input portion, in order to prevent destruction of an internal circuit by surge voltage such as static electricity applied to an input terminal 1, between the input terminal 1, a power source potential VDD and a ground potential GND, a P-channel MOS transistor (hereinafter, an MOS transistor will be referred to simply as MOS and the P-channel MOS will be referred to as PMOS) 2 and an N-channel MOS (hereinafter, referred to as NMOS) 3 are arranged so as to protect the inner circuit.

That is, the PMOS 2 has a gate a and a source connected to the power source potential VDD and a drain connected to the input terminal 1 so as to operate as a diode connected in the reverse direction. Moreover, the NMOS has a gate and a source connected to the ground potential GND and a drain connected to the input terminal 1 so as to similarly operate as a diode connected in the reverse direction.

In such an input portion, when a positive surge voltage is applied to the input terminal 1, the PMOS 2 is turned on and electric current flows from the input terminal 1 via the PMOS 2 to the power source potential VDD. Moreover, when a negative surge voltage is applied to the input terminal 1, the NMOS 3 is turned on and electric current flows from the ground potential GND via the NMOS 3 to the input terminal 1. This controls the positive and negative potential increase of the input terminal 1 and protects the input terminal connected to the input terminal 1 from destruction by static electricity.

Since the PMOS 2 and the NMOS 3 are diode-connected in the reverse direction, they are off during a normal operation. However, in the MOS transistor, a current called off-leak current flows even in an off state. The off-leak current is a total of sub threshold current generated between the source and the drain and reverse-direction current in the silicon substrate and the drain pn junction diode, and the total value is very small. However, the off-leak current depends on the dimension of the gate of the MOS, varies depending on the ambient temperature, and especially the current value becomes large under a high temperature (for example, 100° C.). Moreover, in the PMOS 2 and the NMOS 3 in the input portion, a gate width W is made large as compared to a gate length L so as to increase the protection ability (for example, W/L=1000) and accordingly, the off-leak current becomes large. Furthermore, the off-leak current has become large because of lowering of a threshold value voltage due to the reduced voltage of the power source.

When an off-leak current flows to the PMOS 2 and NMOS 3 in the input portion, the off-leak current changes the potential of the input terminal 1 and affects the analog operation in the internal circuit. For example, in FIG. 2, the off-leak current IL flowing in the PMOS 2 divided to flow to the NMOS 3 and the signal source connected to the input terminal 1. The current flowing into the signal source fluctuates the potential of the input terminal 1, which disables normal analog operation in the internal circuit.

SUMMARY OF THE INVENTION

The present invention may provide an off-leak current cancel circuit for canceling an off-leak current in a MOS transistor.

An off-leak current cancel circuit of the present invention includes an input terminal, an input protection circuit, a current cancel circuit and a current providing circuit. The input protection circuit has a first protection transistor connected between the input terminal and a high power supply potential source, and a second protection transistor connected between the input terminal and a low power supply potential source. The first protection transistor flows a first off-leak current. The second protection transistor flows a second off-leak current. The current cancel circuit has a first monitor transistor for flowing a third off-leak current that is a first times smaller than the first off-leak current, and a cancellation circuit for flowing the first off-leak current to the low power supply potential source in response to the third off-leak current. The current providing circuit has a second monitor transistor for flowing a fourth off-leak current that is a second times smaller than the second off-leak current, and a providing circuit for providing the second off-leak current from the high power supply potential source in response to the fourth off-leak current.

DETAILED DESCRIPTION OF THE PREFERRED EMBODIMENTS

Figure 1:
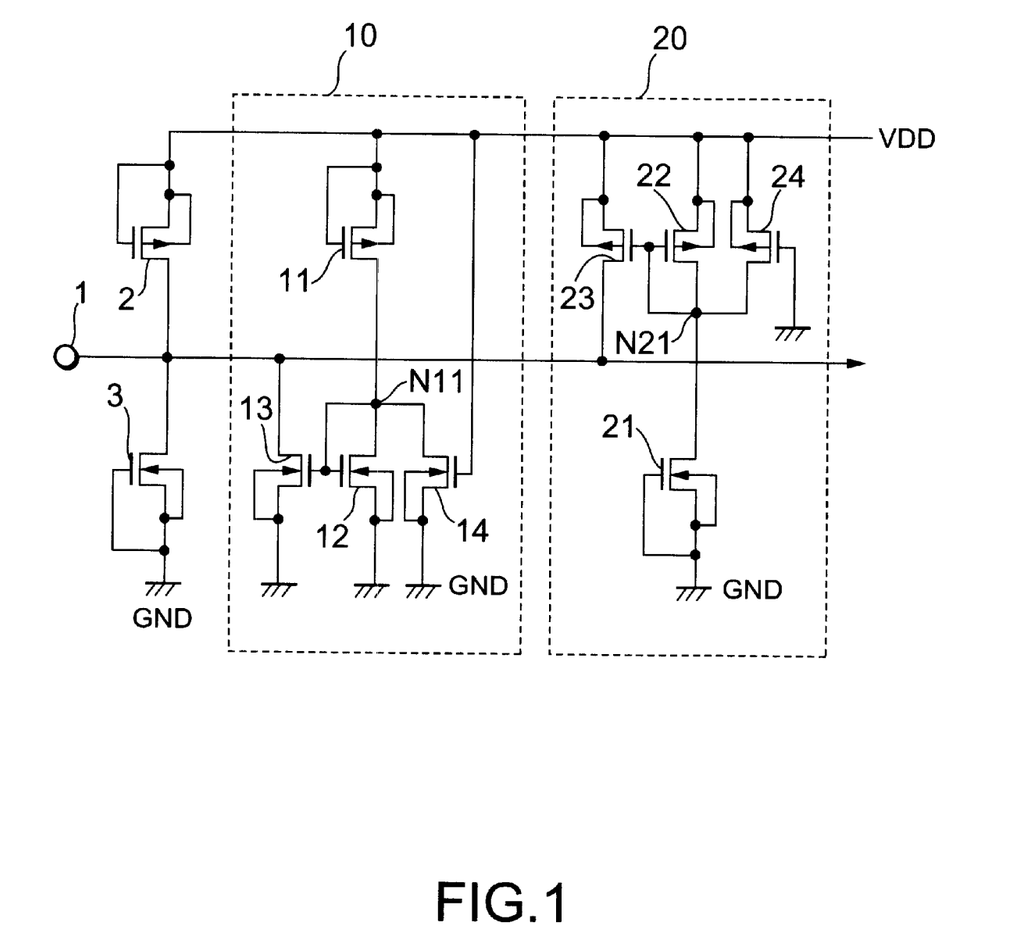
FIG. 1 shows configuration of an off-leak current cancel circuit according to a first embodiment of the present invention.

FIG. 1 shows configuration of an off-leak current cancel circuit according to a first embodiment of the present invention.

This off-leak current cancel circuit is a circuit for canceling an off-leak current of an input circuit protecting PMOS 2 and NMOS 3 connected between the input terminal 1, a power source potential VDD, and a ground potential GND, and has cancel portions 10 and 20 formed on the semiconductor substrate of the PMOS 2 and NMOS 3.

The cancel portion 10 cancels off-leak current of the PMOS 2 and includes a PMOS 11 and NMOS 12, 13, 14. The PMOS 11 has a gate length identical to the PMOS 2 (for example, 0.2 micrometers) and a gate width about ⅕ (for example, 50 micrometers) of the gate width of the PMOS 2 (for example, 250 micrometers). The PMOS 11 has a source and a gate connected to the power source potential VDD and a drain connected to the node N11. That is, the PMOS 11 is diode-connected in the reverse direction like the PMOS 2 and configured so that ⅕ of the off-leak current flowing in the PMOS 2 flows.

The node N11 is connected to the drain and the gate of the NMOS 12 whose source is connected to the ground potential GND. The NMOS 12 has a gate length and a gate width formed, for example, to be 1 micrometer. Furthermore, the node N11 is connected to the gate of the NMOS 13 whose drain and source are connected to the input terminal 1 and to the ground potential GND, respectively.

The NMOS 13 has a gate length identical to the NMOS 12, i.e., 1 micrometer and a gate width formed to be 5 micrometers which is the gate width of NMOS 12 multiplied by 5. That is, the NMOS 12 and 13 constitute a current mirror circuit and the current flowing in the NMOS 12 multiplied by 5 flows in the NMOS 13.

Moreover, the node N11 and the ground potential GND are connected to the drain and the source of the NMOS 14, respectively, and the gate of the NMOS 14 is connected to the power source potential VDD. Accordingly, the NMOS 14 is always in on state. The NMOS 14 has a gate length of 100 micrometers and a gate width of 0.1 micrometers, so as to exhibit quite a high resistance. Thus, when almost no off-leak current is present in the PMOS 11, the NMOS 14 makes the node N11 the ground potential GND for stability of the operation.

On the other hand, the cancel portion 20 cancels off-leak current of the NMOS 3 and includes NMOS 21 and PMOS 22, 23, 24. The NMOS 21 has a gate length identical to the NMOS 3 (for example, 0.2 micrometers) and a gate width about ⅕ (for example, 50 micrometers) of the gate width of the NMOS 3 (for example, 250 micrometers). The NMOS 21 has a source and a gate connected to the ground GND and a drain connected to the node N21. That is, the NMOS 21 is diode-connected in the reverse direction like the NMOS 3 and configured so that ⅕ of the off-leak current flowing in the NMOS 3 flows.

The node N21 is connected to the drain and the gate of the PMOS 22 whose source is connected to the power source potential VDD. The PMOS 22 has a gate length and a gate width formed, for example, to be 1 micrometer. Furthermore, the node N21 is connected to the gate of the PMOS 23 whose drain and source are connected to the input terminal 1 and to power source potential VDD, respectively.

The PMOS 23 has a gate length identical to the PMOS 22, i.e., 1 micrometer and a gate width formed 5 micrometers which is the gate width of PMOS 22 multiplied by 5. That is, the PMOS 22 and 23 constitute a current mirror circuit and the current flowing in the PMOS 22 multiplied by 5 flows in the PMOS 23.

Moreover, the node N21 and the power source potential VDD are connected to the drain and the source of the PMOS 24, respectively, and the gate of the PMOS 24 is connected to the ground potential GND. Accordingly, the PMOS 24 is always in on state. The PMOS 24 has a gate length of 100 micrometers and a gate width of 0.1 micrometers, so as to exhibit quite a high resistance. Thus, when almost no off-leak current is present in the NMOS 21, the node N21 is made to the power source potential VDD for stability of the operation.

Next, explanation will be given on operation.

For example, when the ambient temperature is a room temperature and there is almost no off-leak current, the NMOS 14 of the cancel portion 10 is in an ON state and accordingly, the node N11 is almost ground potential GND and the NMOS 12 and 13 are in an OFF state. Similarly, the PMOS 24 of the cancel portion 20 is in an ON state and accordingly, the node N21 becomes almost power source potential VDD and PMOS 22 and 23 become OFF.

Here, it is assumed that the ambient temperature has increased and off-leak current of 10 μA flows. The PMOS 2 and the PMOS 11 in the cancel portion 10 are formed on the same semiconductor substrate and have an identical gate length. Accordingly, off-leak current also flows in this PMOS 11 for monitoring. When the gate length is identical, the off-leak current flowing is proportional to the gate width and accordingly, the off-leak current flowing in the PMOS 11 becomes ⅕ of the PMOS 2, i.e., 2 μA. The off-leak current flowing in the PMOS 11 flows into the node N11.

The node N11 is connected to the NMOS 12 and 14 but since the NMOS 14 has quite a high resistance, almost no current flows. Accordingly, in the NMOS 12, current almost identical to the PMOS 11, i.e., 2 μA flows. The NMOS 12 is connected to the NMOS 13 constituting a current mirror circuit of the current ratio of 5 multiples. Thus, current of 10 μA flows via the NMOS 13 to the ground potential GND.

Thus, the off-leak current of 10 μA flowing in the PMOS 2 all flows into the ground potential GND via the NMOS 13 and no off-leak current flows into the signal source connected to the input terminal 1.

Similarly, the off-leak current flowing in the NMOS 3 is detected by the NMOS 21 for monitoring of the cancel portion 20 and supplied from the power source potential VDD via the PMOS 23 to the NMOS 3. Accordingly, no off-leak current flows to the signal source connected to the input terminal 1.

As has been described above, the off-leak current cancel circuit of the first embodiment has a cancel portion including the PMOS 11 for monitoring the off-leak current intensity proportional to the off-leak current flowing from the power source potential VDD into the input circuit protecting PMOS 2 and the NMOS 13 for flowing off-leak current flowing in the PMOS 2 according to the current flowing in the PMOS 11, to the ground potential GND. Moreover, the off-leak current cancel circuit has a cancel portion 20 for supplying the off-leak current flowing from the input circuit protecting NMOS 3 to the ground potential GND, from the power source potential VDD to the PMOS 23. Thus, the off-leak current flowing in the PMOS 2 and the NMOS 3 is canceled and it is possible to prevent flowing of the off-leak current to the signal source connected to the input terminal 1.

Figure 3:
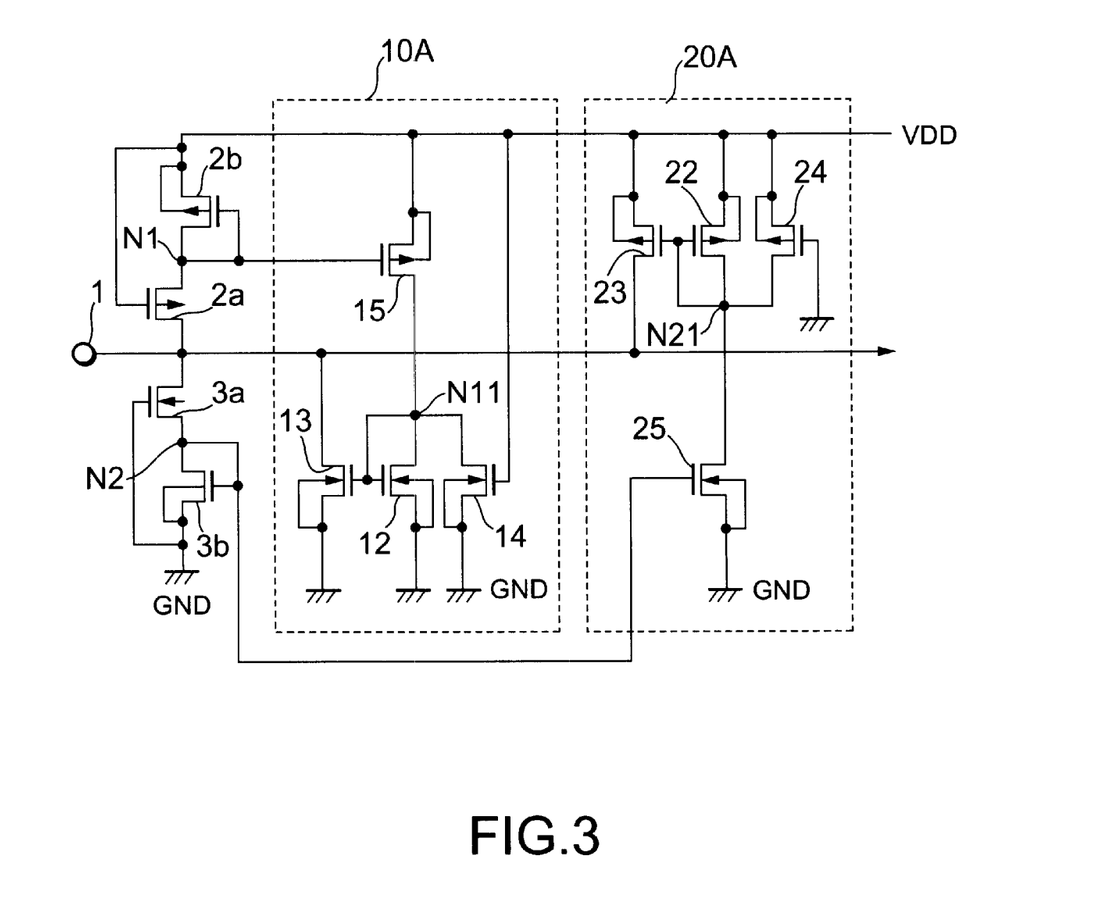
FIG. 3 shows configuration of an off-leak current cancel circuit according to a second embodiment of the present invention.

FIG. 3 shows configuration of an off-leak current cancel circuit according to a second embodiment of the present invention. Like components as in FIG. 1 are denoted by like reference symbols.

This off-leak current cancel circuit has an input circuit protecting PMOS 2a between the input terminal 1 and the power source potential VDD and a PMOS 2b connected in series to the PMOS 2a. The input terminal 1 is connected to the drain of the PMOS 2a which has a source and a gate connected to the node N1 and the power source potential VDD, respectively. The node N1 is connected to the drain and the gate of the PMOS 2b, and the source of the PMOS 2b is connected to the power source potential VDD.

Moreover, between the input terminal 1 and the ground potential GND, there are arranged an input circuit protecting NMOS 3a and an NMOS 3b connected in series to this. The input terminal 1 is connected to the drain of the NMOS 3a which has a source and a gate connected to the node N2 and the ground potential GND, respectively. The node N2 is connected to the drain of the NMOS 3b and the source of the NMOS 3b is connected to the ground potential GND.

Furthermore, this off-leak current cancel circuit has cancel portions 10A and 10B having configurations slightly different from those of cancel portions 10 and 20 in FIG. 1.

The cancel portion 10A, instead of the PMOS 11 for monitoring the off-leak current in the cancel portion 10, includes a PMOS 15 constituting a current mirror circuit for the input circuit protecting PMOS 2b. That is, the PMOS 15 has a source and a drain connected to the power source potential VDD and to the node N11, respectively and a gate connected to the node N1.

Similarly, instead of the NMOS 21 for monitoring the off-leak current in the cancel portion 20, the cancel portion 20A includes an NMOS 25 constituting a current mirror circuit for the input circuit protecting NMOS 3b. The NMOS 25 has a source and a drain connected to the ground potential GND and to the node N21, respectively, and a gate connected to the node N2. The other configuration portion is identical to that of FIG. 1.

Next, explanation will be given on operation.

When the ambient temperature is a room temperature and there is almost no off-leak current, the PMOS 2a and 2b are in an OFF state and ON state, respectively. The node N1 is almost at the power source potential VDD, and no current flows in the PMOS 15 of the cancel portion 10A. Similarly, the NMOS 3a and 3b are in an OFF state and ON state, respectively, the node N2 has become the ground potential GND, and no current flows in the NMOS 25 of the cancel portion 20A.

Here, when the ambient temperature increases and off-leak current flows in the PMOS 2a, identical off-leak current also flows in the PMOS 2b connected in series to this. This generates a detection voltage corresponding to the off-leak current in the node N1 and a current corresponding to this off-leak current flows in the PMOS 15 of the cancel portion 10A, and identical current flows in the NMOS 12. Furthermore, current identical to the off-leak current flows in the NMOS 13 constituting the current mirror circuit. Accordingly, the off-leak current flowing in the PMOS 2a flows via the NMOS 13 to the ground potential GND and no off-leak current flows to the signal source connected to the input terminal 1.

Similarly, off-leak current flowing in the NMOS 3a is detected by the NMOS 25 of the cancel portion 20A and a current corresponding to the off-leak current flows from the power source potential VDD via the PMOS 23 to this NMOS 3a. Accordingly, no off-leak current flows to the signal line connected to the input terminal 1.

As has been described above, the off-leak current cancel circuit according to the second embodiment includes the PMOS 2b for monitoring off-leak current flowing in the input circuit protecting PMOS 2a from the power source potential VDD and the cancel portion 10A for detecting the current flowing in the PMOS 2b and flowing the off-leak current flowing in the PMOS 2a to the ground potential GND. Moreover, the off-leak current cancel circuit includes the NMOS 3b for monitoring the off-leak current flowing in the input circuit protecting NMOS 3a and the cancel portion 20A for detecting the current flowing in the NMOS 3b supplying the off-leak current flowing in the NMOS 3a from the power source potential VDD. This cancels the off-leak current flowing in the PMOS 2a and NMOS 3a, thereby preventing flow of the off-leak current to the signal source connected to the input terminal 1.

Figure 4:
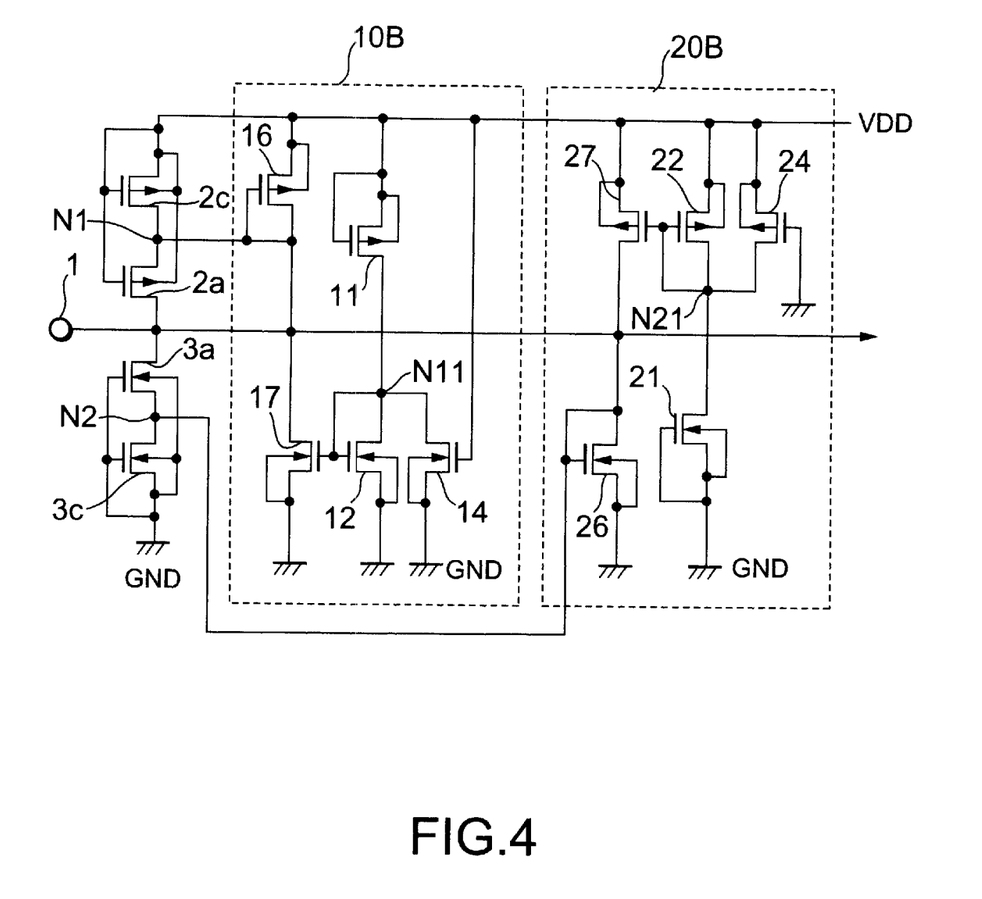
FIG. 4 shows configuration of an off-leak current cancel circuit according to a third embodiment of the present invention.

FIG. 4 shows configuration of an off-leak current cancel circuit according to a third embodiment of the present invention. Like components as in FIG. 1 are denoted by like reference symbols in FIG. 3.

This off-leak current cancel circuit has an input circuit protecting PMOS 2a and 2c between the input terminal 1 and the power source potential VDD. The input terminal 1 is connected to the drain of the PMOS 2a and the source of the PMOS 2a is connected to the node N1. The node N1 is connected to the drain of the PMOS 2c, and the source of the PMOS 2c is connected to the power source potential VDD. Moreover, gates of the PMOS 2a and 2c are connected to the power source potential VDD, so that power source potential VDD is applied to these bulk potentials.

Moreover, between the input terminal 1 and the ground potential GND, there are arranged an input circuit protecting NMOS 3a and 3c connected in series. The input terminal 1 is connected to the drain of the NMOS 3a and the source of the NMOS 3a is connected to the node N2. The node N2 is connected to the drain of the NMOS 3c and the source of the NMOS 3c is connected to the ground potential GND. Moreover, the gates of the NMOS 3a and 3c are connected to the ground potential GND, so that the ground potential GND is applied to these bulk potentials.

Furthermore, this off-leak current cancel circuit has cancel portions 10B and 20B having configurations slightly different from the cancel portions 10 and 20 in FIG. 1.

The cancel portion 10B, instead of the NMOS 13 in the cancel portion 10, includes a PMOS 16 and an NMOS 17. The PMOS 16 has a source connected to the power source potential VDD and a gate and a drain connected to the node N1. Moreover, the NMOS 17 has a drain connected to the node N1, a gate connected to node N11, and a source connected to the ground potential GND.

Moreover, instead of the PMOS 23 in the cancel portion 20, the cancel portion 20B includes an NMOS 26 and a PMOS 27. The NMOS 26 has a source connected to the ground potential GND and a gate and drain connected to the node N2. Moreover, the PMOS 27 has a drain connected to the node N2, a gate connected to the node N21, and a source connected to the power source potential VDD. The other configuration portion is identical to that of FIG. 1.

Next, explanation will be given on the operation.

When the ambient temperature is a room temperature and there is almost no off-leak current, the NMOS 14 of the cancel portion 10B is in an ON state and accordingly, the node N11 is almost at the ground potential GND, and the NMOS 12 and 17 are in off state. Similarly, the PMOS 24 of the cancel portion 20B is in an ON state and accordingly, the node N21 is almost at the power source potential VDD, and the PMOS 22 and 27 are in an OFF state.

Here, when the ambient temperature increases and off-leak current flows in the PMOS 2a and 2c, off-leak current flows in the PMOS 11 for monitoring the cancel portion 10B. The off-leak current flowing in the PMOS 11 flows into the node N11 and via the NMOS 12 to the ground potential GND. Since the NMOS 12 is connected to the NMOS 17 constituting the current mirror circuit, current proportional to the off-leak current also flows in this NMOS 17.

Since the current flowing in the NMOS 17 is supplied from the power source potential VDD via the PMOS 16, the potential of the node N1 is lowered than the power source potential VDD. Accordingly, the voltage between the source and the drain of the PMOS 2c is reduced and the off-leak current flowing in this PMOS 2c is reduced. Furthermore, the potential of the node N1 is applied to the source of the PMOS 2a and the bulk potential of this PMOS 2a has become the power source potential VDD. Thus, the threshold value voltage of the PMOS 2a is increased by the back gate effect and the off-leak current of the PMOS 2a is reduced.

Similarly, when an off-leak current flows in the NMOS 21 for monitoring the cancel portion 20B, this off-leak current is supplied from the power source potential VDD via the PMOS 22 from the node N21. Since the PMOS 22 is connected to the PMOS 27 constituting the current mirror circuit, a current proportional to the off-leak current also flows in this PMOS 27.

Since the current flowing in the PMOS 27 flows via the NMOS 26 to the ground potential GND, the potential of the node N2 is increased higher than the ground potential GND. Accordingly, the voltage between the source and the drain of the NMOS 3c is reduced and the off-leak current flowing in the NMOS 3c is reduced. Furthermore, the potential of the node N2 is applied to the source of the NMOS 3a and the bulk potential of this NMOS 3a has become the ground potential GND. Thus, the threshold value voltage of the NMOS 3a is increased by the back gate effect and the off-leak current of the NMOS 3a is reduced.

As has been described above, the off-leak current cancel circuit according to the third embodiment includes the cancel portion 10B having the PMOS 11 for monitoring off-leak current and PMOS 17 and PMOS 16 for reducing the potential of the node N1 according to the current flowing in the PMOS 11. This can reduce the voltage between the drain and the source of the input circuit protecting PMOS 2c and reduce the off-leak current as well as increase the threshold value voltage by the back gate effect of the PMOS 2a, thereby reducing the off-leak current.

Similarly, the off-leak current cancel circuit includes the cancel portion 20B having the NMOS 21 monitoring the off-leak current and NMOS 27 and NMOS 26 for reducing the potential of the node N2 according to the current flowing in this NMOS 21. This can reduce the voltage between the drain and the source of the input circuit protecting NMOS 3c and reduce the off-leak current as well as increase the threshold value voltage by the back gate effect of the NMOS 3a, thereby reducing the off-leak current.

Figure 5:
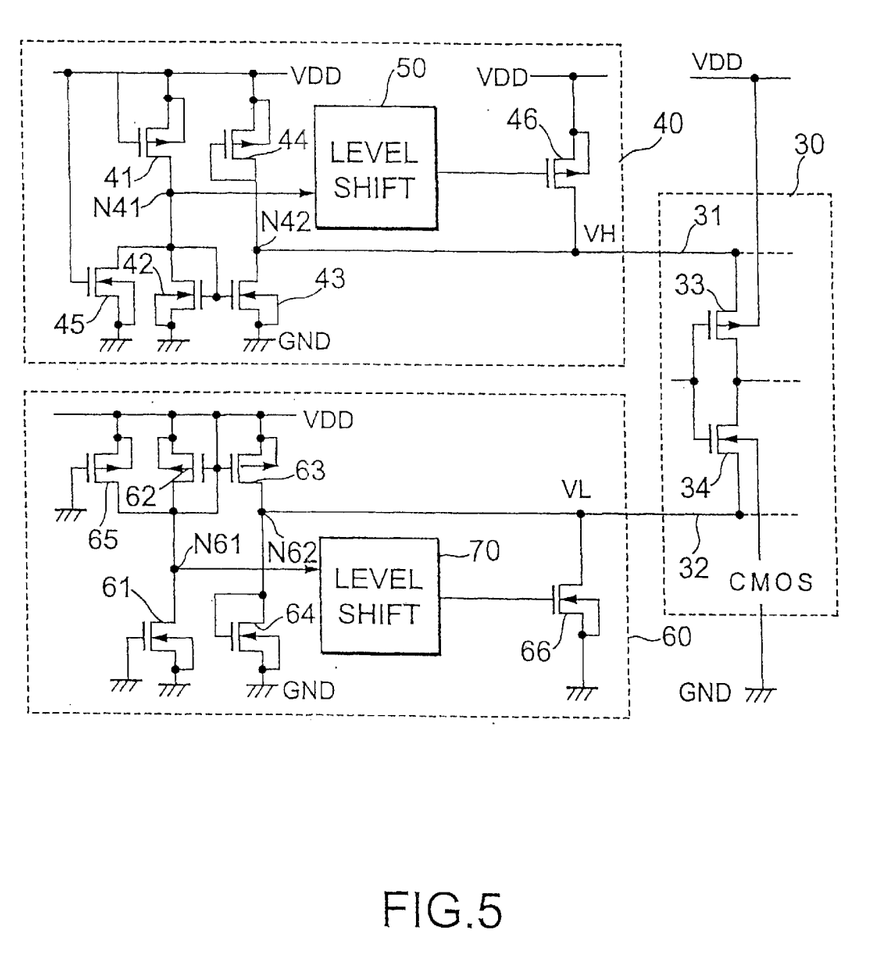
FIG. 5 shows configuration of an off-leak current cancel circuit according to a fourth embodiment of the present invention.

FIG. 5 shows configuration of an off-leak current cancel circuit according to a fourth embodiment of the present invention.

In this off-leak current cancel circuit, by controlling the power source voltage VH, VL applied to the power source lines 31, 32 of the CMOS circuit block 30, the off-leak current of the PMOS 33 and NMOS 34 is reduced. The PMOS 33 has a source connected to the power source line 31 so that the power source voltage VH is applied and the NMOS 34 has a source connected to the power source line 32 so that the power source voltage VL is applied. Power source potential VDD is applied to the bulk potential of the PMOS 33 and the ground potential GND is applied to the bulk potential of the NMOS 34.

This off-leak current cancel circuit is provided on the same semiconductor substrate as the CMOS circuit block 30 and includes control blocks 40 and 60 for controlling the power source voltages VH and VL according to the state of the off-leak current of the PMOS 33 and the NMOS 34 in the CMOS circuit block 30.

The control block 40 includes a PMOS 41 for monitoring the off-leak current. The PMOS 41 has a source and a drain connected to the power source potential VDD and the node N41, respectively, and a gate connected to the power source potential VDD so as to be in an OFF state. The node N41 is connected to a drain and a gate of the NMOS 42, and a source of the NMOS 42 is connected to the ground potential GND. The node N41 is further connected to a gate of NMOS 43, and this NMOS 43 has a drain and a source connected to the node N42 and to the ground potential GND, respectively.

The node N42 is connected to a drain and a gate of the PMOS 44, and a source of the PMOS 44 is connected to the power source potential VDD. Moreover, the node N41 and the ground potential GND are connected to a drain and a source of NMOS 45, respectively, and a gate of the NMOS 45 is connected to the power source potential VDD. The NMOS 45 has a gate length and gate width formed to be, for example, 100 micrometers and 0.1 micrometer, respectively, so as to exhibit a very high resistance value.

The node N41 is connected to an input side of an off-leak detector (for example, a level shift block) 50. The level shift block 50 decides whether off-leak current is present according to the potential of the node N41 and outputs a signal of level "H" or "L" according to the decision result. The level shift block 50 has an output side connected to the gate of the PMOS 46 for switching. The PMOS 46 has a source and a drain connected to the power source potential VDD and to the node N42, respectively. Power source voltage VH is output from the node N42 to the power source line 31.

Similarly, the control block 60 has an NMOS 61 for monitoring the off-leak current. The NMOS 61 has a source and a drain connected to the ground potential GND and the node N61, respectively, and a gate connected to the ground potential GND. The node N61 is connected to a drain and a gate of a PMOS 62 and this PMOS 62 has a source connected to the power source potential VDD. The node N61 is further connected to a gate of a PMOS 63 and this PMOS 63 has a drain and a source connected to the node N62 and the power source potential VDD, respectively.

The node N62 is connected to a drain and a gate of an NMOS 64 and this NMOS 64 has a source connected to the ground potential GND. Moreover, the node N61 and the power source potential VDD are connected to a drain and a source of a PMOS 65, respectively, and this PMOS 65 has a gate connected to the ground potential GND. The PMOS 65 has a gate length and a gate width formed, for example, to be 100 micrometers and 0.1 micrometer, respectively, so as to always exhibit a very high resistance value.

The node N61 is connected to an input side of an off-leak detector (for example, level shift block) 70. The level shift block 70 decides whether off-leak current is present according to the potential of the node N61 and outputs a signal of level "H" or "L" according to the decision result. The level shift block 70 has an output side connected to the gate of the NMOS 66 for switching. The NMOS 66 has a source and a drain connected to the ground potential GND and to the node N62, respectively. Power source voltage VL is output from the node N62 to the power source line 32.

Figure 6A:
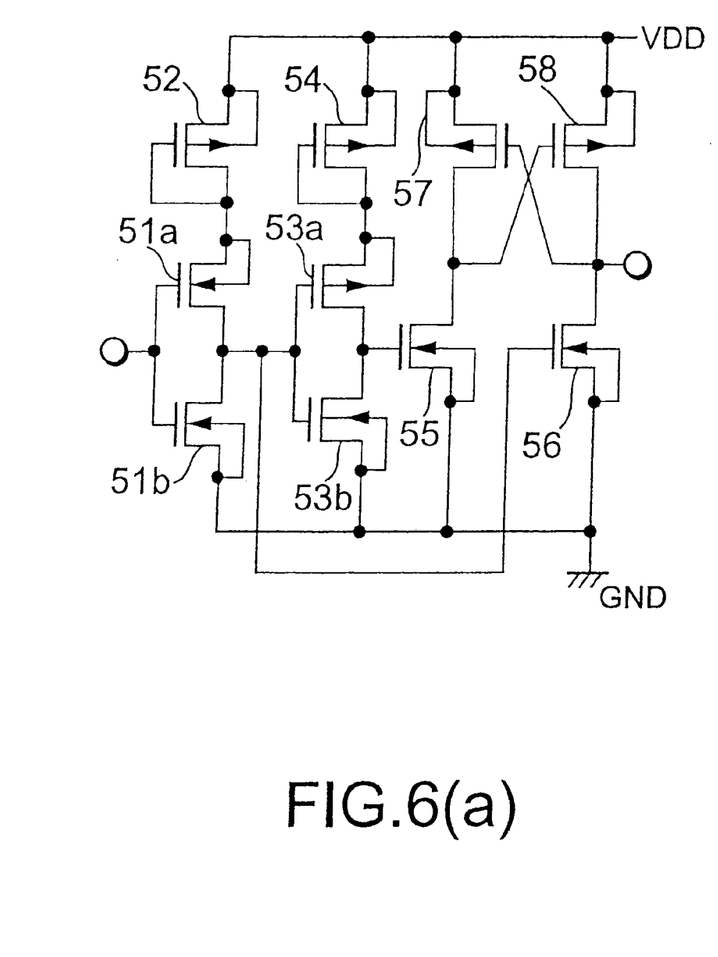
FIG. 6A and FIG. 6B show examples of level shift portions shown in FIG. 5.
Figure 6B:
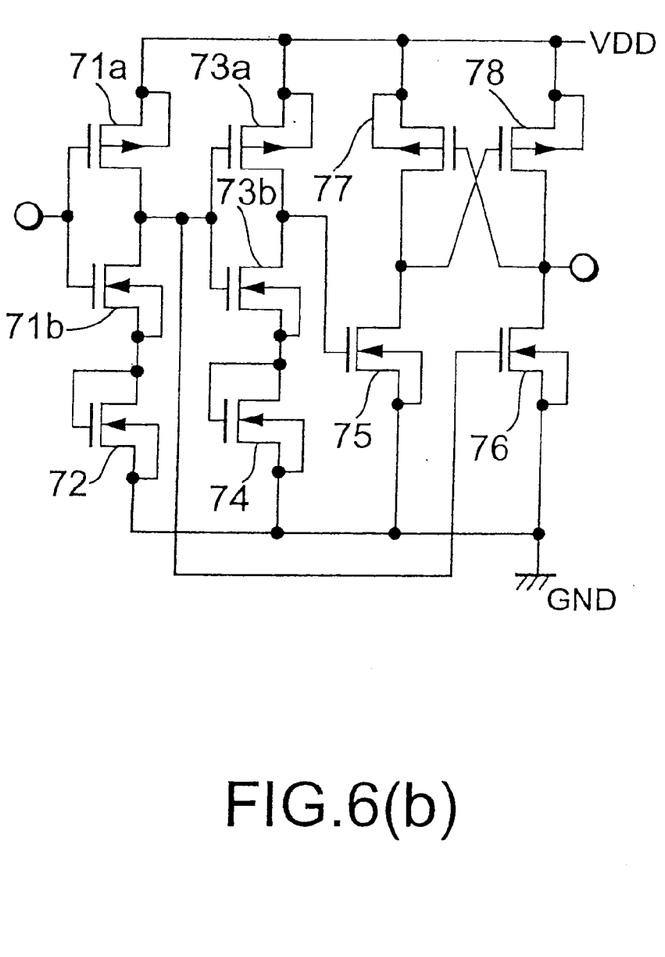

FIG. 6A and FIG. 6B are circuit diagrams showing examples of the level shift block in FIG. 5. FIG. 6A shows the level shift block 50 and FIG. 6B shows the level shift block 70.

The level shift block 50 includes a PMOS 51a and an NMOS 5ib constituting a CMOS inverter and potential of the node N41 is applied to the gates of the PMOS 51a and the NMOS 51b. The NMOS 51b has a source connected to the ground potential GND and the PMOS 51a has a source connected to the power source potential VDD via a PMOS 52 diode-connected in the forward direction. The drains of the PMOS 51a and the NMOS 51b are connected to the gates of PMOS 53a and NMOS 53b constituting an inverter. The source of the NMOS 53b is connected to the ground potential GND and the source of PMOS 53a is connected to the power source potential VDD via the PMOS 54 diode-connected in the forward direction.

The PMOS 53a and the NMOS 53b have drains connected to the gate of the NMOS 55 while the PMOS 51a and the NMOS 51b have drains connected to the gate of the NMOS 56. The NMOS 55 and 56 have sources connected to the ground potential GND and drains connected to the power source potential VDD via the PMOS 57 and 58, respectively. The PMOS 58 has a gate connected to a drain of PMOS 57 and the PMOS 57 has a gate connected to a drain of PMOS 58. An output signal is output from the drain of the PMOS 58.

In this level shift block 50, a low level potential of the node N41 is analog-amplified in two stages by inverters longitudinally connected, and output as differential signals from the inverter constituted from PMOS 51a and NMOS 51b, and the inverter constituted from PMOS 53a and NMOS 53b. The differential signals are applied to the gates of the NMOS 56 and 55 constituting a switching circuit and a digitized signal of "H" or "L" is output from the drain of the PMOS 58.

Similarly, the level shift block 70 includes a PMOS 71a and NMOS 71b constituting an inverter and potential of the node N61 is applied to the gates of the PMOS 71a and the NMOS 71b. The PMOS 71a has a source connected to the power source potential VDD and the NMOS 71b has a source connected to the ground potential GND via an NMOS 72 diode-connected in the forward direction. The drains of the PMOS 71a and the NMOS 71b are connected to the gates of a PMOS 73a and an NMOS 73b constituting an inverter. The source of the PMOS 73a is connected to the power source potential VDD and the source of NMOS 73b is connected to the ground potential GND via the NMOS 74 diode-connected in the forward direction.

The PMOS 73a and the NMOS 73b have drains connected to the gate of the NMOS 75 while the PMOS 71a and the NMOS 71b have drains connected to the gate of the NMOS 76. The NMOS 75 and 76 have sources connected to the ground potential GND and drains connected to the power source potential VDD via the PMOS 77 and 78, respectively. The PMOS 78 has a gate connected to a drain of the PMOS 77 and the PMOS 77 has a gate connected to a drain of the PMOS 78. An output signal is output from the drain of the PMOS 58.

In this level shift block 70, a high level potential of the node N61 is analog-amplified in two stages by inverters longitudinally connected, and output as differential signals from the inverter constituted from PMOS ha and NMOS 71b, and the inverter constituted from PMOS 73a and NMOS 73b. The differential signals are applied to the gates of the NMOS 76 and 75 constituting a switching circuit and a digitized signal of "H" or "L" is output from the drain of the PMOS 78.

Next, explanation will be given on operation.

When the ambient temperature is a room temperature and there is almost no off-leak current in the NMOS 61 for monitoring, the PMOS 65 in the control block 60 is in an ON state and accordingly, the node N61 becomes almost power source potential VDD and the PMOS 62 and 63 are in an OFF state. The potential of the node N61 is applied to the level shift block 70 and a signal "H" is output from this level shift block 70. Thus, the NMOS 66 becomes ON and a power source voltage VL almost identical to the ground potential GND is output from the ground potential GND via the NMOS 66 to the node N62, i.e., the power source line 32.

Here, if the ambient temperature increases and off-leak current flows in the PMOS 41, the potential of the node N41 increases. When the potential of the node N41 exceeds a predetermined value, the signal output from the level shift block 50 becomes "H" and the PMOS 46 becomes OFF. The off-leak current flowing in the PMOS 41 flows into the ground potential GND via the NMOS 42 and the current mirror circuit constituted by this NMOS 42 and NMOS 43 operates to lower the potential of the node N42. Accordingly, the power source voltage VH of the power source line 31 becomes lower than the power source potential VDD.

In the PMOS 33 and the like in the CMOS circuit block 30, the power source potential VDD is applied to the bulk potential and a power source voltage VH having potential lower than this is applied to the source. Thus, in the PMOS 33 and the like, the threshold value voltage is increased by the back gate effect and the off-leak current is reduced.

Similarly, when an off-leak current flows in the NMOS 61, the potential of the node N61 is lowered. When the potential of the node N61 becomes lower than a predetermined value, the signal output from the level shift block becomes "L" and the NMOS 66 becomes OFF. The off-leak current flowing in the NMOS 61 flows to the power source potential VDD via the PMOS 62 and the current mirror circuit constituted by this PMOS 62 and the PMOS 63 operates to increase the potential of the node N62. Thus, the power source voltage VL of the power source line 32 becomes higher than the ground potential GND.

In the NMOS 34 and the like in the CMOS circuit block 30, the ground potential GND is applied to the bulk potential and a power source voltage VL having potential higher than this is applied to the source. Thus, in the NMOS 34 and the like, the threshold value voltage is increased by the back gate effect and the off-leak current is reduced.

As has been described above, the off-leak current cancel circuit of the fourth embodiment has the PMOS 41 for monitoring the off-leak current of the PMOS and the control block 40 for controlling the power source voltage VH applied to the CMOS circuit block 30, according to the potential of the node N41 varying according to the current flowing in the PMOS 41. Thus, it is possible to increase the threshold value voltage of the PMOS 33 and the like in the CMOS circuit block 30 and control the off-leak current of the PMOS.

Moreover, the off-leak current cancel circuit of the fourth embodiment has the NMOS 61 for monitoring the off-leak current of the NMOS and the control block 60 for controlling the power source voltage VL applied to the CMOS circuit block 30, according to the potential of the node N61 varying according to the current flowing in the NMOS 61. Thus, it is possible to increase the threshold value voltage of the NMOS 34 and the like in the CMOS circuit block 30 and control the off-leak current of the PMOS. Furthermore, it is possible to reduce current consumption in vain by suppressing the off-leak current.

It should be noted that the present invention is not to be limited to the aforementioned embodiments but may be modified in various ways. For example, modifications as follows can be performed.

The off-leak current cancel circuit of FIG. 1 is not limited to an input protecting circuit of the CMOS semiconductor integrated circuit and can be applied to a circuit handling analog voltage in the integrated circuit.

The off-leak current cancel circuit of FIG. 3 is not limited to an input protecting circuit of the CMOS semiconductor integrated circuit and can be applied as an ordinary transistor power source control circuit in the integrated circuit.

The off-leak current cancel circuit of FIG. 4 is not limited to an input protecting circuit of the CMOS semiconductor integrated circuit and can be applied as an ordinary transistor power down control circuit in the integrated circuit.

The off-leak current cancel circuit of FIG. 5 controls the power source voltage VH, VL with respect to the CMOS circuit block 30 by using the PMOS 41 and the NMOS 61 for monitoring the off-leak current. However, it is also possible to provide an external control terminal and apply a control signal to this so as to suppress the off-leak current.

What is claimed is:

1. An off-leak current cancel circuit comprising:
   an input terminal;
   an input protection circuit connected to the input terminal, the input protection circuit having a first protection transistor including a drain connected to the input terminal and a source and a gate both of which are connected to a high power supply potential source, and a second protection transistor having a drain connected to the input terminal and a source and a gate both of which are connected to a low power supply potential source, the first protection transistor provides a path for a first off-leak current and the second protection transistor provides a path for a second off-leak current;
   a current cancel circuit connected to the first protection transistor and the high and low power supply potential sources, the current cancel circuit having a first monitor transistor through which a third off-leak current that is n times smaller than the first off-leak current flows, and a cancellation circuit connected to the first protection transistor, the first monitor transistor and the low power supply potential source, and through which the first off-leak current flows to the low power supply potential source responsive to the third off-leak current; and
   a current providing circuit connected to the second protection transistor and the high and low power supply potential sources, the current providing circuit having a second monitor transistor through which a fourth off-leak current that is m times smaller than the second off-leak current flows, and a providing circuit connected to the second protection transistor, the second monitor transistor and the high power supply potential source for providing the second off-leak current from the high power supply potential source responsive to the fourth off-leak current.

2. An off-leak current cancel circuit according to claim 1, wherein the first monitor transistor has a source and a gate both of which are connected to the high power supply potential source and a drain connected to a first node, and wherein the cancellation circuit has a first current mirror circuit connected between the low power supply potential source at one end, and the first node and the first protection transistor at a second end.

3. An off-leak current cancel circuit according to claim 1, wherein the second monitor transistor has a source and a gate both of which are connected to the low power supply potential source and a drain connected to a second node, and wherein the providing circuit has a second current mirror circuit connected between the high power supply potential source at one end, and the second node and the second protection transistor at a second end.

4. An off-leak current cancel circuit according to claim 1, wherein a gate length of the first monitor transistor is substantially equal to that of the first protection transistor and wherein a gate width of the first monitor circuit is n times smaller than that of the first protection transistor.

5. An off-leak current cancel circuit according to claim 2, wherein the cancellation circuit further includes a first additional transistor having a source connected to the low power supply potential source, a drain connected to the first node and a gate connected to the high power supply potential source.

6. An off-leak current cancel circuit according to claim 3, wherein the providing circuit further includes a second additional transistor having a source connected to the high power supply potential source, a drain connected to the second node and a gate connected to the low power supply potential source.

7. An off-leak current cancel circuit comprising:
   an input terminal;
   an input protection circuit connected to the input terminal, the input protection circuit having
      a first protection transistor including a drain connected to the input terminal, a gate connected to a high power supply potential source and a source, the first protection transistor provides a path for a first off-leak current,
      a second protection transistor having a drain connected to the input terminal, a gate connected to a low power supply potential source, and a source, the second protection transistor provides a path for a second off-leak current,
      a third protection transistor having a source and a gate both of which are connected to the high power supply potential source, and a drain connected to the source of the first protection transistor, and
      a fourth protection transistor having a source and a gate both of which are connected to the low power supply potential source and a drain connected to the source of the second protection transistor;
   a current cancel circuit connected to the first protection transistor and the high and low power supply potential sources, the current cancel circuit having
      a first monitor transistor through which a third off-leak current that is n times smaller than the first off-leak current flows,
      a first current mirror transistor including a source connected to the high power supply potential source, a gate connected to the drain of the third protection transistor and a drain connected to the drain of the third protection transistor, and
      a cancellation circuit connected to the first protection transistor, the first monitor transistor and the low power supply potential source, and through which the first off-leak current flows to the low power supply potential source responsive to the third off-leak current; and
   a current providing circuit connected to the second protection transistor and the high and low power supply potential sources, the current providing circuit having
      a second monitor transistor through which a fourth off-leak current that is m times smaller than the second off-leak current flows,
      a second current mirror transistor including a source connected to the low power supply potential source, a gate connected to the drain of the fourth protection transistor and a drain connected to the drain of the fourth protection transistor, and
      a providing circuit connected to the second protection transistor, the second monitor transistor and the high power supply potential source for providing the second off-leak current from the high power supply potential source responsive to the fourth off-leak current.

8. An off-leak current cancel circuit according to claim 7, wherein the first monitor transistor has a source and a gate both of which are connected to the high power supply potential source and a drain connected to a first node, and wherein the cancellation circuit has a first current mirror circuit connected between the low power supply potential source at one end, and the first node and the first protection transistor at a second end.

9. An off-leak current cancel circuit according to claim 7, wherein the second monitor transistor has a source and a gate both of which are connected to the low power supply potential source and a drain connected to a second node, and wherein the providing circuit has a second current mirror circuit connected between the high power supply potential source at one end, and the second node and the second protection transistor at a second end.

10. An off-leak current cancel circuit according to claim 7, wherein a gate length of the first monitor transistor is substantially equal to that of the first protection transistor and wherein a gate width of the first monitor circuit is n times smaller than that of the first protection transistor.

11. An off-leak current cancel circuit according to claim 8, wherein the cancellation circuit further includes a first additional transistor having a source connected to the low power supply potential source, a drain connected to the first node and a gate connected to the high power supply potential source.

12. An off-leak current cancel circuit according to claim 9, wherein the providing circuit further includes a second additional transistor having a source connected to the high power supply potential source, a drain connected to the second node and a gate connected to the low power supply potential source.

13. An off-leak current circuit comprising:
a CMOS circuit having a plurality of PMOS transistors each of which has a source coupled to a first power source line and a back gate coupled to a high power supply voltage level, and a plurality of NMOS transistors each of which has a source coupled to a second power source line and a back gate coupled to a low power supply voltage level;
a first voltage control circuit connected to the high power supply voltage level, the first voltage control circuit providing an internal high voltage level to the first power source line when an off-leak current is detected, and providing the high power supply voltage level that is higher than the internal high voltage level to the first power source line when no off-leak current is detected; and
a second voltage control circuit connected to the low power supply voltage level, the second voltage control circuit providing an internal low voltage level to the second power source line when an off-leak current is detected, and providing the low power supply voltage level that is lower than the internal low voltage level to the second power source line when no off-leak current is detected.

14. An off-leak current circuit according to claim 13, wherein the first voltage control circuit includes a first off-leak monitoring circuit connected to the high power supply voltage level, the first off-leak monitoring circuit having a first node at which the low power supply voltage level is provided when no off-leak current is detected, and at which a rising voltage level that is higher than the low power supply voltage level is provided when the off-leak current is detected, and a second node connected to the sources of the first power source line at which the internal high voltage level is provided;
a first off-leak detecting circuit connected to the first node of the first off-leak monitoring circuit, the first off-leak detecting circuit outputting a first detecting signal in response to the rising voltage level; and
a high power supply voltage supplying circuit connected to the first off-leak detecting circuit and the second node, the high power supply voltage supplying circuit providing the high power supply voltage level to the second node in response to the first detecting signal.

15. An off-leak current circuit according to claim 13, wherein the second voltage control circuit includes
a second off-leak monitoring circuit connected to the low power supply voltage level, the second off-leak monitoring circuit having a third node at which the high power supply voltage level is provided when no off-leak current is monitored, and at which a decreasing voltage level that is lower than the high power supply voltage level is provided when the off-leak current is detected, and a fourth node connected to the second power source line at which the internal low voltage level is provided;
a second off-leak detecting circuit connected to the third node of the second off-leak monitoring circuit, the second off-leak detecting circuit outputting a second detecting signal in response to the decreasing voltage level; and
a low power supply voltage supplying circuit connected to the second off-leak detecting circuit and the fourth node, the low power supply voltage supplying circuit providing the low power supply voltage level to the fourth node in response to the second detecting signal.

16. An off-leak current circuit according to claim 14, wherein the first off-leak detecting circuit is a level shift circuit and the high power supply voltage supplying circuit is a PMOS transistor.

17. An off-leak current circuit according to claim 15, wherein the second off-leak detecting circuit is a level shift circuit and the low power supply voltage supplying circuit is an NMOS transistor.

* * * * *